(12) United States Patent
Kalnitsky et al.

(10) Patent No.: US 11,043,531 B2
(45) Date of Patent: *Jun. 22, 2021

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Alexander Kalnitsky, San Francisco, CA (US); Sheng-Huang Huang, Hsinchu (TW); Harry-Hak-Lay Chuang, Hsinchu County (TW); Jiunyu Tsai, Hsinchu (TW); Hung Cho Wang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/689,918

(22) Filed: Nov. 20, 2019

(65) Prior Publication Data

US 2020/0091230 A1 Mar. 19, 2020

Related U.S. Application Data

(63) Continuation of application No. 15/961,157, filed on Apr. 24, 2018, now Pat. No. 10,504,958.

(60) Provisional application No. 62/583,313, filed on Nov. 8, 2017.

(51) Int. Cl.
*H01L 27/00* (2006.01)
*H01L 27/22* (2006.01)
(Continued)

(52) U.S. Cl.
CPC .......... *H01L 27/226* (2013.01); *G11C 11/161* (2013.01); *H01F 10/3254* (2013.01);
(Continued)

(58) Field of Classification Search
None
See application file for complete search history.

(56) References Cited

U.S. PATENT DOCUMENTS 9,425,387 B1 *   8/2016   Liu ..................... H01L 43/08
9,691,969 B2     6/2017   Chuang et al.
(Continued)

FOREIGN PATENT DOCUMENTS

CN   106558598 A   4/2017
CN   107068856 A   8/2017
TW   201727887 A   8/2017

OTHER PUBLICATIONS

Office Action and Search Report dated on Jul. 29, 2020 issued by Taiwan Intellectual Property Office for counterpart application No. 107139557.

(Continued)

*Primary Examiner* — Reema Patel
(74) *Attorney, Agent, or Firm* — WPAT, P.C., Intellectual Property Attorneys; Anthony King

(57) ABSTRACT

The present disclosure provides a semiconductor structure having a memory region. The semiconductor structure includes an $N^{th}$ metal layer in a memory region and a periphery region, the periphery region spanning a wider area than the memory region, a plurality of magnetic tunneling junctions (MTJs) over the $N^{th}$ metal layer, the plurality of MTJs having at least one of mixed pitches and mixed sizes, a top electrode via over each of the plurality of MTJs; and an $(N+M)^{th}$ metal layer over the plurality of MTJs. A method for manufacturing the semiconductor structure is also disclosed.

20 Claims, 14 Drawing Sheets

(51) Int. Cl.
    *H01L 43/02*     (2006.01)
    *H01F 10/32*     (2006.01)
    *H01F 41/34*     (2006.01)
    *G11C 11/16*     (2006.01)
    *H01L 43/12*     (2006.01)

(52) U.S. Cl.
    CPC ........... H01F 41/34 (2013.01); H01L 27/222 (2013.01); H01L 43/02 (2013.01); H01L 43/12 (2013.01); *H01F 10/329* (2013.01)

(56) References Cited

U.S. PATENT DOCUMENTS

| | | | |
|---|---|---|---|
| 10,504,958 B2* | 12/2019 | Kalnitsky | H01F 10/3254 |
| 2008/0164617 A1* | 7/2008 | Assefa | H01L 43/12 257/774 |
| 2011/0121417 A1* | 5/2011 | Li | H01L 43/08 257/421 |
| 2012/0056253 A1* | 3/2012 | Iwayama | H01L 27/228 257/295 |
| 2016/0020249 A1* | 1/2016 | Ko | H01L 43/02 257/427 |
| 2017/0092847 A1* | 3/2017 | Kim | H01L 43/12 |

OTHER PUBLICATIONS

U.S. Pat. No. 9,691,969 is the counterpart application to Foreign Reference TW 201727887 A.

Office Action and Search Report dated Jun. 4, 2020 issued by China National Intellectual Property Administration for counterpart application No. 201811324752.8.

\* cited by examiner

SEMICONDUCTOR STRUCTURE AND MANUFACTURING METHOD OF THE SAME

CROSS REFERENCE TO RELATED APPLICATIONS

This application claims the benefit of prior-filed provisional application No. 62/583,313, filed Nov. 8, 2017, and non-provisional application Ser. No. 15/961,157, filed Apr. 24, 2018.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
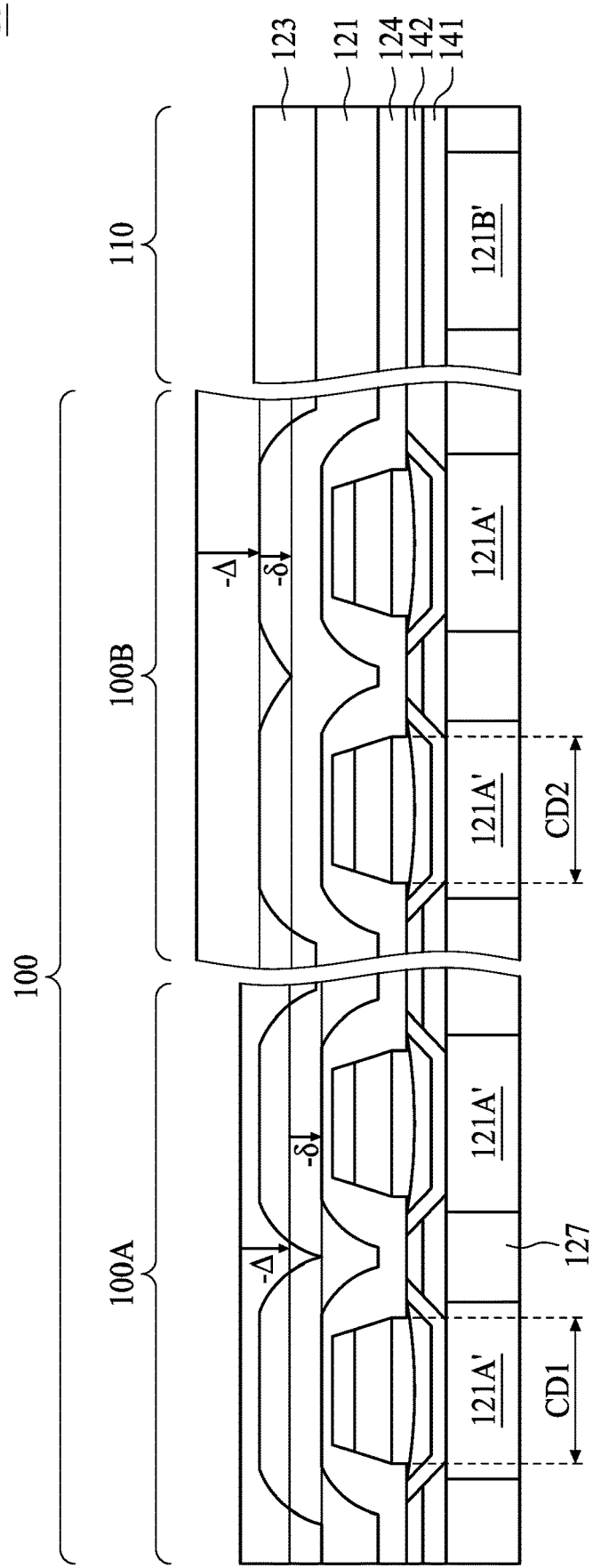
FIG. 1 is a cross section of a semiconductor structure with a mixed sizes MTJ array.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. Conventionally, the MRAM cell is embedded between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

Integrated circuit with mixed pitches and/or mixed sizes MTJ array can generate several problems. Conventionally, a backside anti-reflective coating (BARC) is etched back until the exposure of a top electrode of the MTJ. The BARC etch back operation plays an important role in back-end-of-line (BEOL) interconnects in the logic and memory regions. Nevertheless, the BARC etch back encounter various problems when a mixed pitches and/or a mixed sizes MTJ array is to be fabricated. For example, as shown in FIG. 1, a semiconductor structure 10 includes a memory region 100 and a periphery of logic region 110. The memory region 100 includes at least a first size region 100A having a critical dimension CD1 of 70 nanometer and a second size region 100B having a critical dimension CD2 of 100 nanometer. Even if the pitches between adjacent MTJs are fixed in the first size region 100A and the second size region 100B, space between adjacent MTJs with greater critical dimension is narrower than that with smaller critical dimension. Therefore, the oxide layer 121 and the BARC 123 subsequently formed in the space are further piled up in the space between adjacent MTJs in the second size region 100B. When conducting a main etch −Δ during the etch back operation, the oxide layer 121 in the first size region 100A is half-way removed while a top surface of the same in the second size region 100B is just exposed. Moreover, when conducting an over etch −δ during the etch back operation, a spacer layer 124 is exposed in the first size region 100A while the oxide layer 121 in the second size region 100B is just half-way removed. The illustration of FIG. 1 shows the problem of obtaining a uniform BARC etch back result due to the nature of a mixed sizes MTJ array. Similarly, the same problems occur in a mixed pitches MTJ array or a mixed pitches/sizes MTJ array.

The present disclosure provides a manufacturing method achieving a uniform BARC etch back result in a semiconductor structure having a mixed pitches/sizes MTJ array. The semiconductor structure includes a plurality of magnetic tunneling junctions (MTJs) over the $N^{th}$ metal layer. The plurality of MTJs can be arranged in a mixed pitches and/or a mixed sizes fashion. A top electrode via of each of the MTJs appears an upward-concave shape over each MTJs. A planarization etch stop pattern is staggerly disposed over the plurality of MTJs from a top view perspective.

Figure 2:
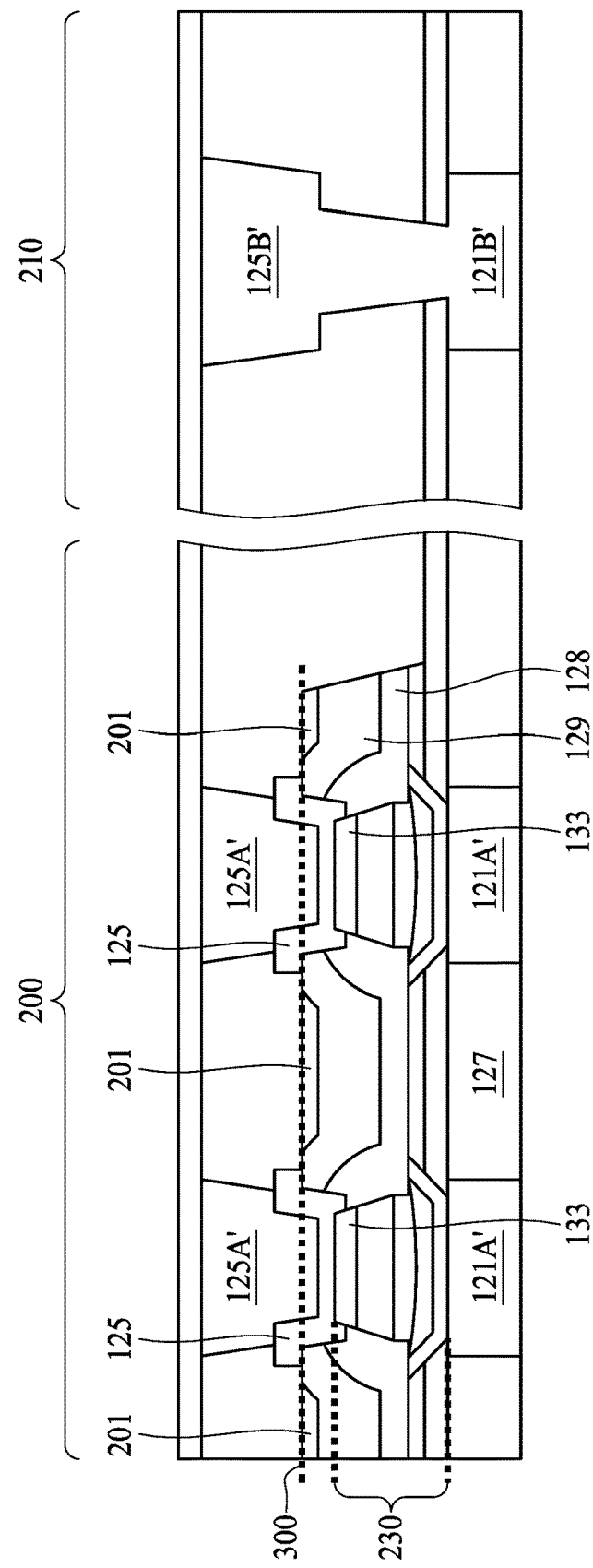
FIG. 2 is a cross section of a semiconductor structure, in accordance with some embodiments of the present disclosure.

Referring to FIG. 2, FIG. 2 is a cross section of a semiconductor structure 20, in accordance with some embodiments of the present disclosure. The semiconductor structure 20 includes a memory region 200 and a periphery region 210. In some embodiments, the periphery region 210 includes logic components such as a transistor structure. An $N^{th}$ metal layer 121A' in the memory region 200 and an $N^{th}$ metal layer 121B' in the periphery region 210 are over at least a transistor structure (not shown). In the memory region 200, an MTJ structure 230 is disposed between an $N^{th}$ metal layer 121A' and an $(N+M)^{th}$ metal layer 125A', whereas in the periphery region 210, the $N^{th}$ metal layer 121B' is connected to the $(N+M)^{th}$ metal layer 125B'. N and M are integers equal to or greater than 1.

In some embodiments, the metal layer referred herein includes metal lines and metal vias composed of copper, gold or another suitable metal or alloy. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers, namely $M_1, M_2 \ldots M_N$. Metal layers $M_1$ through $M_N$ are formed in inter-metal dielectrics (IMDs) 127, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 127 may also be close to 3.8. In some embodiments, the k values of the low-k dielectric materials are lower than about 3.0, and may be lower than about 2.5. The $N^{th}$ metal layer 121A', 121B' and the $(N+1)^{th}$ metal layer 125A', 125B' may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the upper metal layer may be $(N+M)^{th}$ metal layer, where M is an integer greater than 1.

In FIG. 2, the plurality of MTJs 230 are positioned over the first metal layer 121A' in the memory region 200. Although FIG. 2 only illustrates two MTJs 230, various number of MTJs 230 could be adopted as long as the plurality of MTJs includes a mixed sizes and/or a mixed pitches features. By a mixed sizes feature, present disclosure provides at least two different critical dimensions among all the MTJs. By a mixed pitches feature, present disclosure provides at least two different pitches between adjacent MTJs. In some embodiments, only a mixed pitches feature can be observed. In some embodiments, only a mixed sizes feature can be observed. In some embodiments, a mixed pitches feature and a mixed sizes feature can be observed on the semiconductor structure 20. As discussed in FIG. 1, a mixed sizes and/or a mixed pitches MTJ array lead to various space widths in the memory region.

As shown in FIG. 2, a top electrode via 125 is positioned over a top electrode 133 of the MTJ 230. In some embodiments, the top electrode via 125 is in contact with at least the top surface of the top electrode 133 in order to electrically couple to the MTJ 230. In some embodiments, the top electrode via 125 is further in contact with a portion of the sidewall of the top electrode 133 in order to further decrease the resistance. The top electrode via 125 includes a bottom portion, two inclined sidewalls connected to both ends of the bottom portion, and two upper portions connected to the two inclined sidewalls, respectively. As shown in FIG. 2, the MTJ 230 is laterally surrounded by an oxide layer 129, and the two upper portions of the top electrode via 125 are positioned on the top surface of the oxide layer 129. In a top view perspective, a periphery of the top electrode via 125 is supported by the oxide layer 129 and is raised to a higher level than a center of the top electrode via 125. The bottom portion, the two inclined sidewalls, and the two upper portions of the top electrode via 125 form an upward concave shape. Note if the oxide layer 129 is further thinned down to have its top surface lower than the bottom of the top electrode via 125, instead of having an upward concave shape, the top electrode via 125 may appear to have downward concave shape. In this regard, the oxide layer 129 surrounding the MTJs 230 may have a thickness great enough to have its top surface over the bottom of the top electrode via 125.

In FIG. 2, a planarization etch stop layer 201, for example, a chemical mechanical polishing (CMP) stop layer, is positioned over the MTJs 230 and coplanar with the oxide layer 129. The CMP stop layer referred herein indicates an etch stop layer designed for stopping or substantially slow down the CMP operation. As shown in FIG. 2, the planarization etch stop layer 201 possesses a discrete pattern, which means the planarization etch stop layer 201 to the left of one MTJ 230 is not connected to the planarization etch stop layer 201 to the right of the same MTJ 230 in any form. From a top view perspective, as illustrated in FIG. 3, the planarization etch stop layer 201 is staggerly arranged over the MTJs 230, which are illustrated in dotted lines, and the planarization etch stop layer 201 forms a discrete pattern array.

Figure 3:
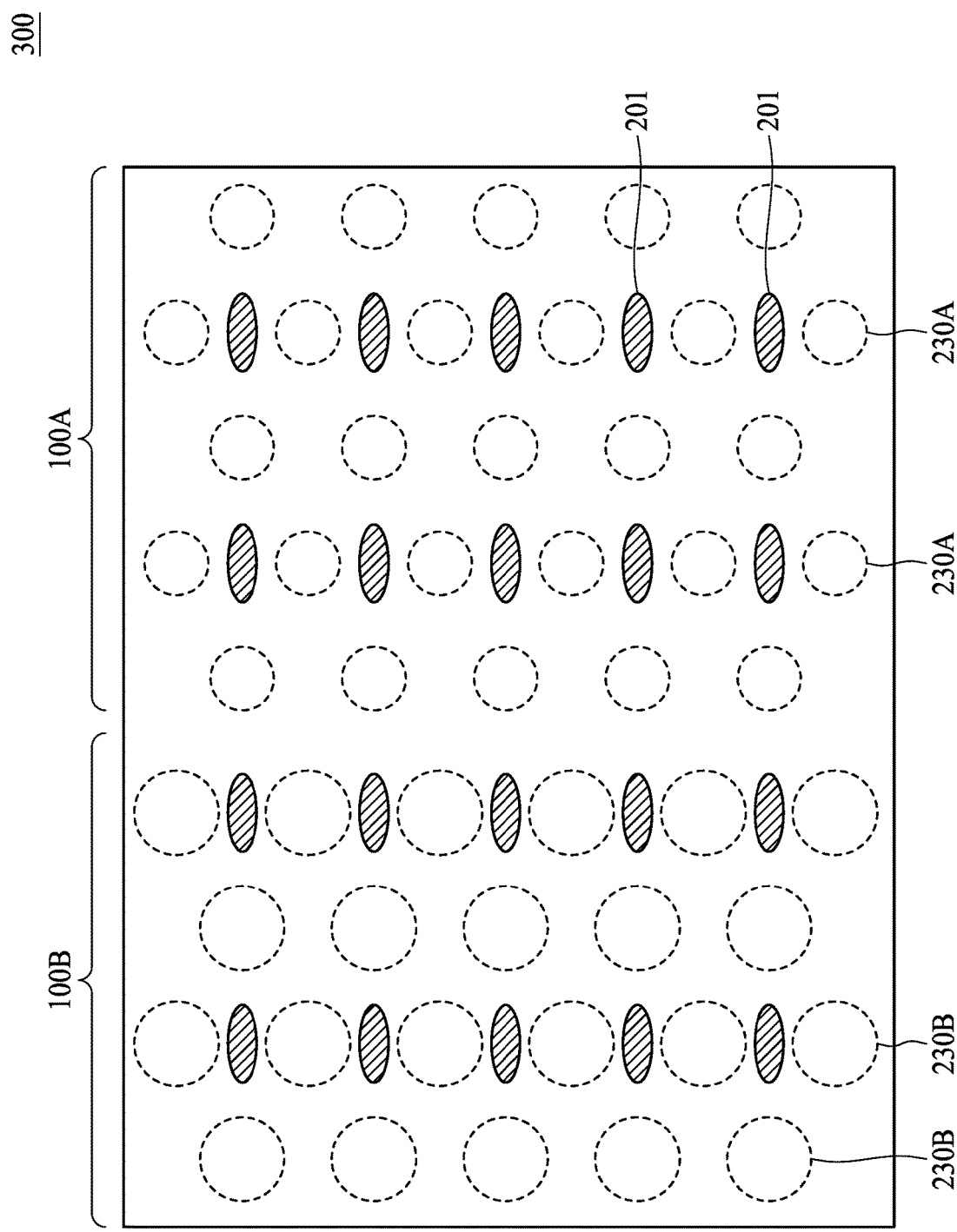
FIG. 3 is a top view of a semiconductor structure showing a staggering arrangement of a planarization etch stop pattern with respect to underlying MTJs, in accordance with some embodiments of the present disclosure.

Referring to FIG. 3, FIG. 3 is a top view of a semiconductor structure showing a staggering arrangement of a planarization etch stop pattern 300 with respect to underlying MTJs 230A and 230B, in accordance with some embodiments of the present disclosure. As shown in FIG. 3, the planarization etch stop layer 201 are composed of discrete patterns staggerly arranged over the MTJs 230A having a smaller size in a first size area 100A and MTJs 230B having a larger size in a second size area 100B. In some embodiments, a discrete pattern of the planarization etch stop layer 201 can be immediately surrounded by four MTJs 230A from four sides. In other embodiments, a discrete pattern of the planarization etch stop layer 201 can be immediately surrounded by two MTJs 230A from two sides.

The planarization etch stop layer 201 functions as an etch stop to a passivation operation, for example, a chemical mechanical polishing (CMP) operation. The planarization etch stop layer 201 shall possess an etch rate different from that of the oxide layer 129 coplanar therewith. In some embodiments, the planarization etch stop layer 201 can be composed of nitride materials. Alternatively, the planarization etch stop layer 201 can be composed of oxynitride materials.

Referring back to FIG. 2, in some embodiments, the planarization etch stop layer 201 is not laterally overlapped with the periphery of the top electrode via 125. However, in other embodiments, the planarization etch stop layer 201 can be laterally overlapped with the periphery of the top electrode via 125. Note a sidewall spacer 128 is laterally contacting a sidewall of the MTJs 230 and the oxide layer 129. The sidewall spacer 128 is configured to protect the sidewall of the MTJs 230 and expose a portion of the top electrode 133, as previously discussed, for example, a top surface and a portion of the sidewall proximal to the top surface, for electrical coupling to the top electrode via 125.

Figure 4:
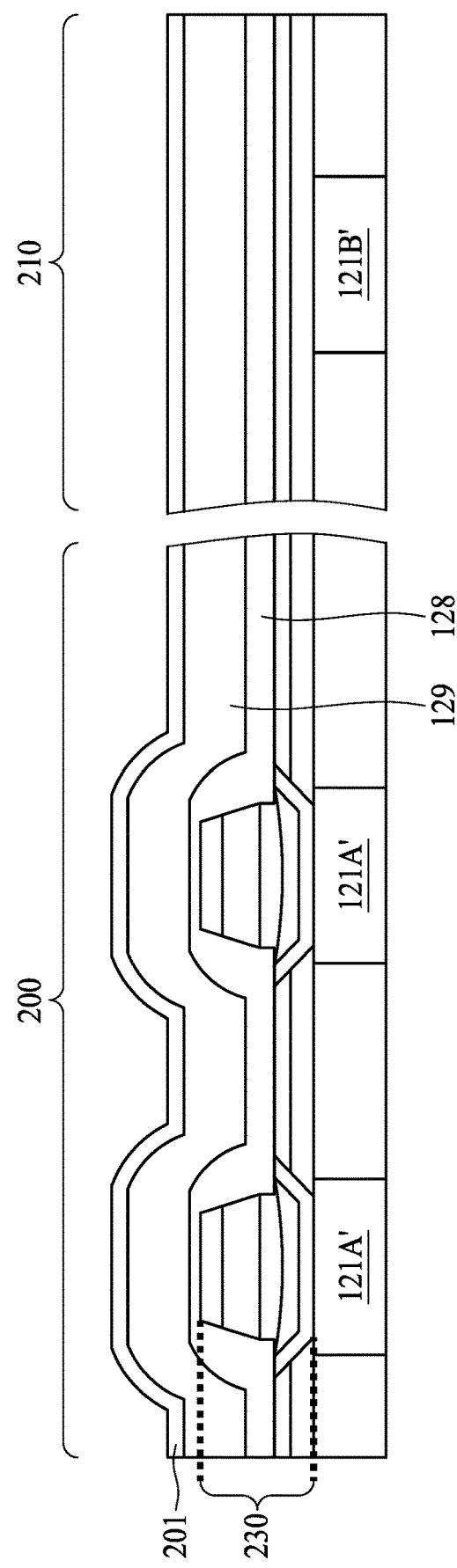
FIG. 4 to FIG. 14 are cross sections of a semiconductor structure fabricated at various stages, in accordance with some embodiments of the present disclosure.

FIG. 4 to FIG. 14 are cross sections of a semiconductor structure fabricated at various stages, in accordance with some embodiments of the present disclosure. In FIG. 4, a plurality of MTJs 230 are formed over the $N^{th}$ metal layer 121A' in the memory region 200. Subsequently, a sidewall spacer 128 is conformally formed over the MTJs 230 and the respective top electrodes 133 in the memory region 200 as well as over the periphery region 210. In some embodiments, the sidewall spacer 128 possesses a thickness of from about 50 Å to about 300 Å. Note a sidewall of the MTJs 230 is surrounded by the sidewall spacer 128 to prevent oxidation or other contamination. Subsequently, an oxide layer 129 is conformally deposited over the sidewall spacer 128 by an atomic layer deposition (ALD) in both the memory region 200 and the periphery region 210. In some embodiments, a plasma-enhanced ALD is adopted to form the oxide layer 129. A thickness of the oxide layer 129 is to be determined according to a level of a top surface thereof relative to the top surface of the top electrode 133. For example, a top surface of the oxide layer 129 at the periphery region 210 is to be greater than or about equal to a top surface of the top electrode 133 of an MTJ 230. As shown in FIG. 4, a top surface of the oxide layer 129 is at least higher than a top surface of the sidewall spacer 128. In some embodiments, present disclosure does not implement any etching operation, selective or non-selective, to the oxide layer 129 so that all the layers subsequently formed follows the contour of the as-deposited oxide layer 129.

Figure 5:
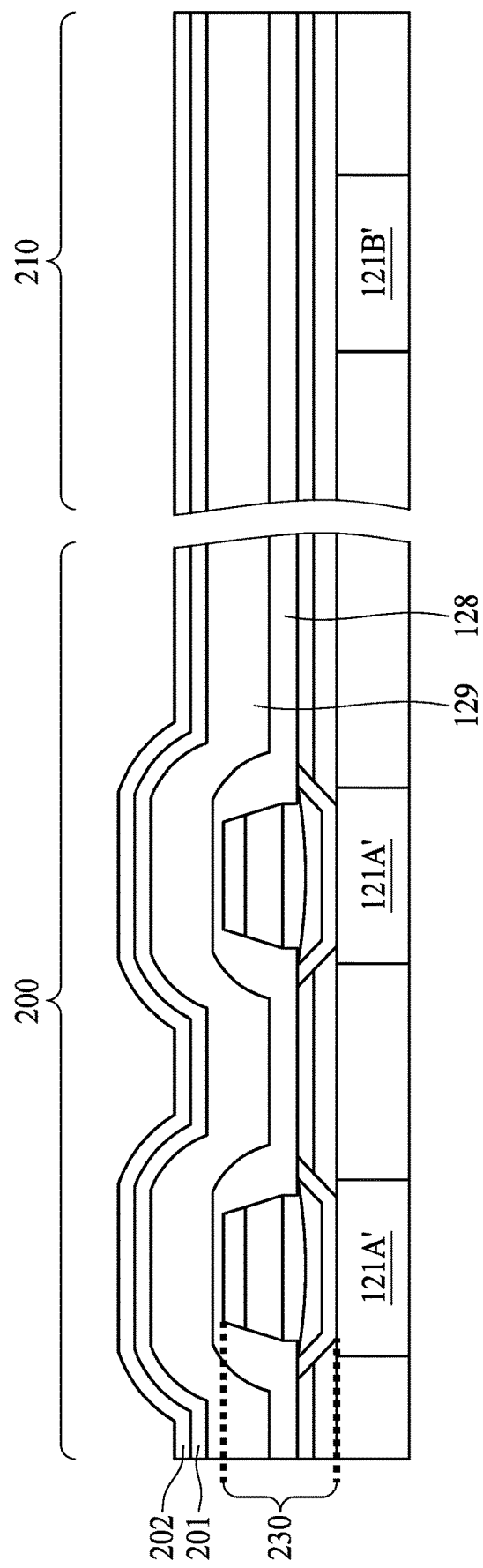
Figure 6:
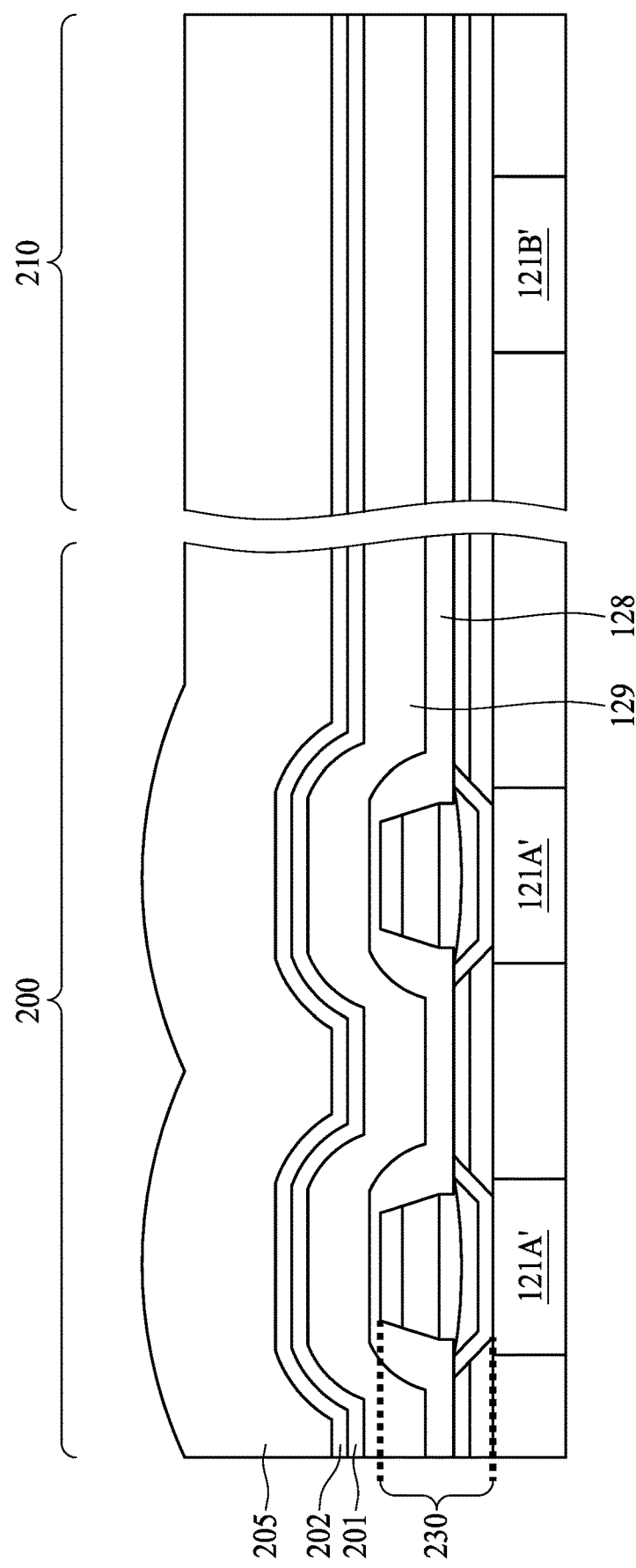

In FIG. 5, a sacrificial layer 202 is formed over the oxide layer 129 in the memory region 200 and the periphery region 210. In some embodiments, the sacrificial layer 202 can be formed of an oxide materials, for example, tetraethoxysilane (TEOS), that functions as an etch decelerator in a BARC etch back operation. In some embodiments, a thickness of the oxide layer 129 is substantially similar to that of the planarization etch stop layer 201. Referring to FIG. 6, an ARC 205, or a BARC, is formed over the sacrificial layer 202 with a thickness of more than 800 Angstrom. The flowable nature of ARC 205 mitigates the step heights between the memory region 200 and the periphery region 210, as well as filling the space between adjacent MTJs 230.

Figure 7:
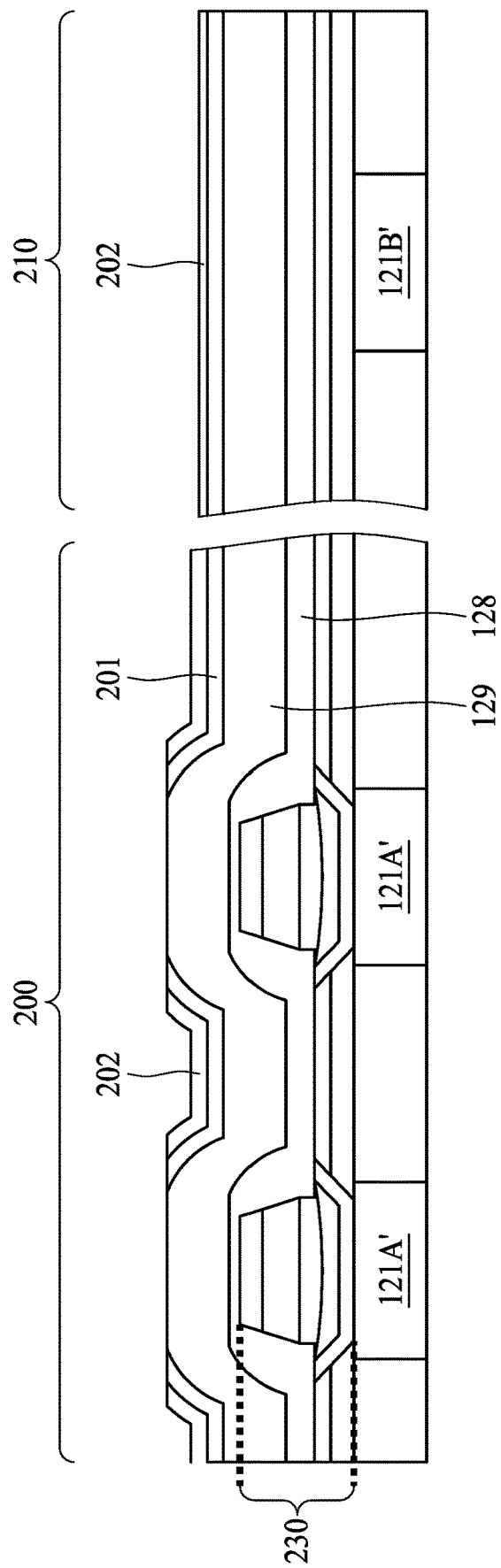

In FIG. 7, an ARC 205 etch back operation is performed by an end point detention approach. Because the periphery region 210 spans a significantly wider coverage compare to the memory region 200, in some embodiments the periphery region 210 occupies more than 90 percent of the entire chip area, when the ARC 205 in the periphery region 210 is substantially consumed and the sacrificial layer 202 is exposed, the ARC 205 signal starting to show a decaying trend. At the same time, the ARC 205 in the memory region 200 is not only completely removed, the etch further removes the underlying sacrificial layer 202 and the planarization etch stop layer 201, until the exposure of the oxide layer 129. At the complete of the ARC 205 etch back operation, the oxide layer 129 is exposed in the memory region 200 over each of the plurality of the MTJs 230 while the sacrificial layer 202 still remain in the periphery region 210.

Figure 8:
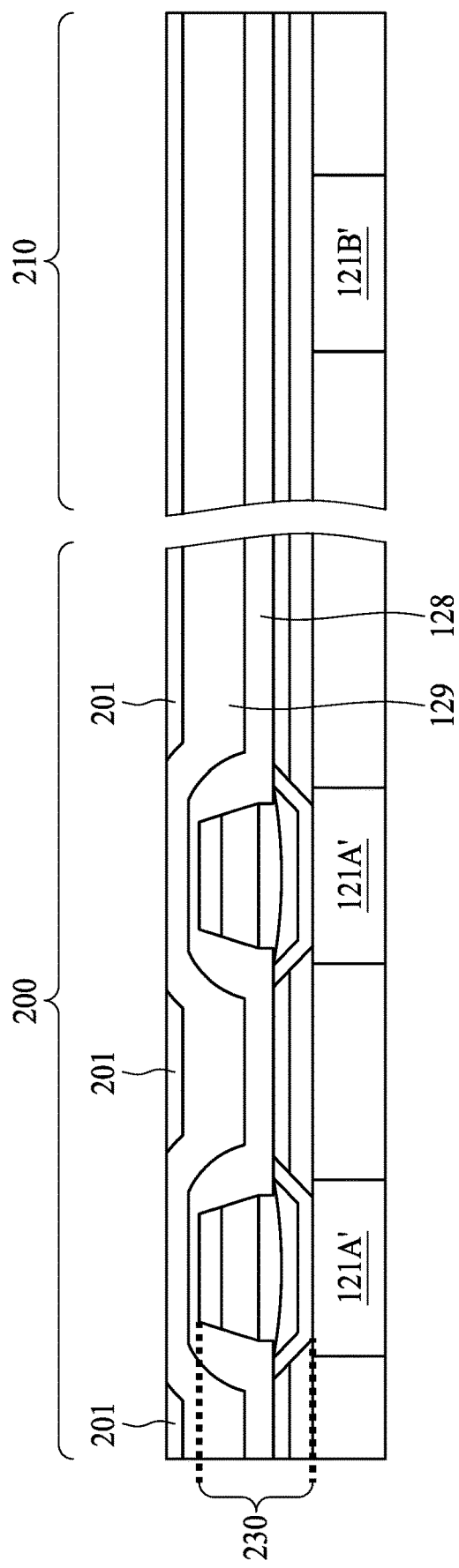

Referring to FIG. 8, a planarization operation is performed over the memory region 200 and the periphery region 210 until the planarization etch stop layer 201 is reached. As previously discussed, because the periphery region 210 occupies significantly greater percentage of the entire chip area compare to the memory region 200, the planarization operation is prone to stop at the level of the planarization etch stop layer 201 in the periphery region 210, rendering complete removal of the sacrificial layer 202 in both regions and a planarized surface having a coplanar oxide layer 129 and a discrete pattern of planarization etch stop layer 201 in the memory region 200, as shown in FIG. 8. In FIG. 8, it should be noted that after the planarization operation, a top surface of the top electrode 133 is not exposed from sidewall spacer 128. Alternatively stated, the top electrode 133 of the MTJ 230 is well protected by the sidewall spacer 128 as well as the oxide layer 129 under the coplanar surface. In order to control the planarization operation to stop at a level higher than the top of the sidewall spacer 128, a top surface of the planarization etch stop layer 201 shall be higher than the top of the sidewall spacer 128 over the top electrode 133.

Figure 9:
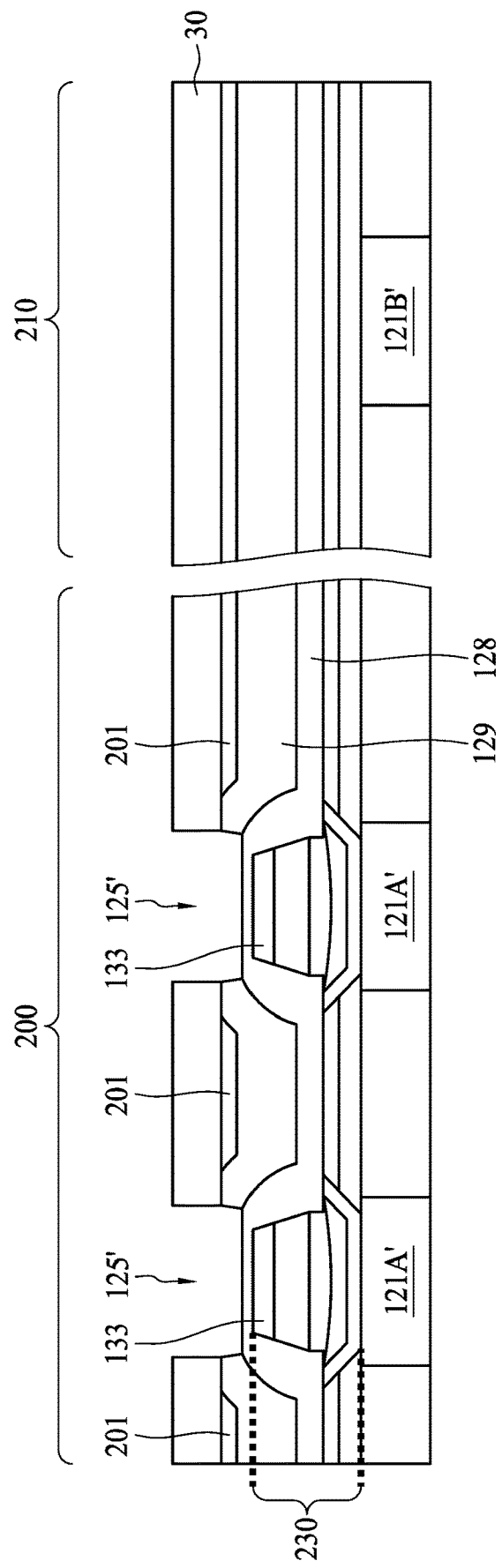

Referring to FIG. 9, in order to form a top electrode via trench 125' having a concaving upward shape over each of the MTJs 230, a first photoresist layer 30 is patterned above the memory region 200 and the periphery region 210. Subsequently, an etch operation is performed penetrating through the oxide layer 129 over the memory region 200 until an exposure of the sidewall spacer 128. It should be noted that the top surface of the top electrode 133 is not exposed from sidewall spacer 128 after the etch operation.

Figure 10:
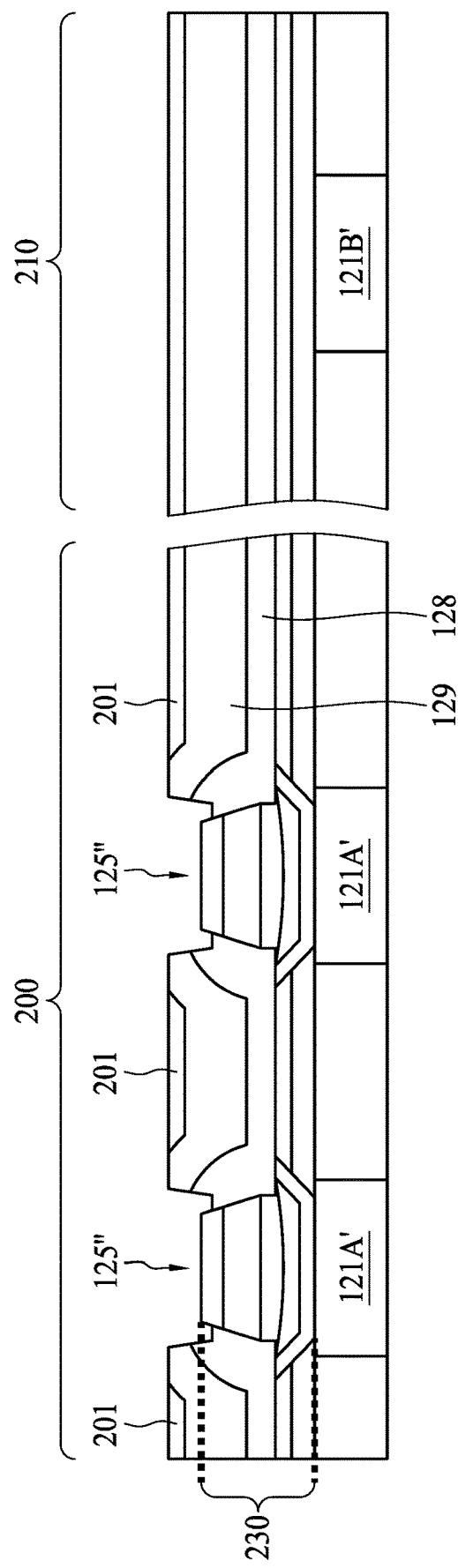
Figure 11:
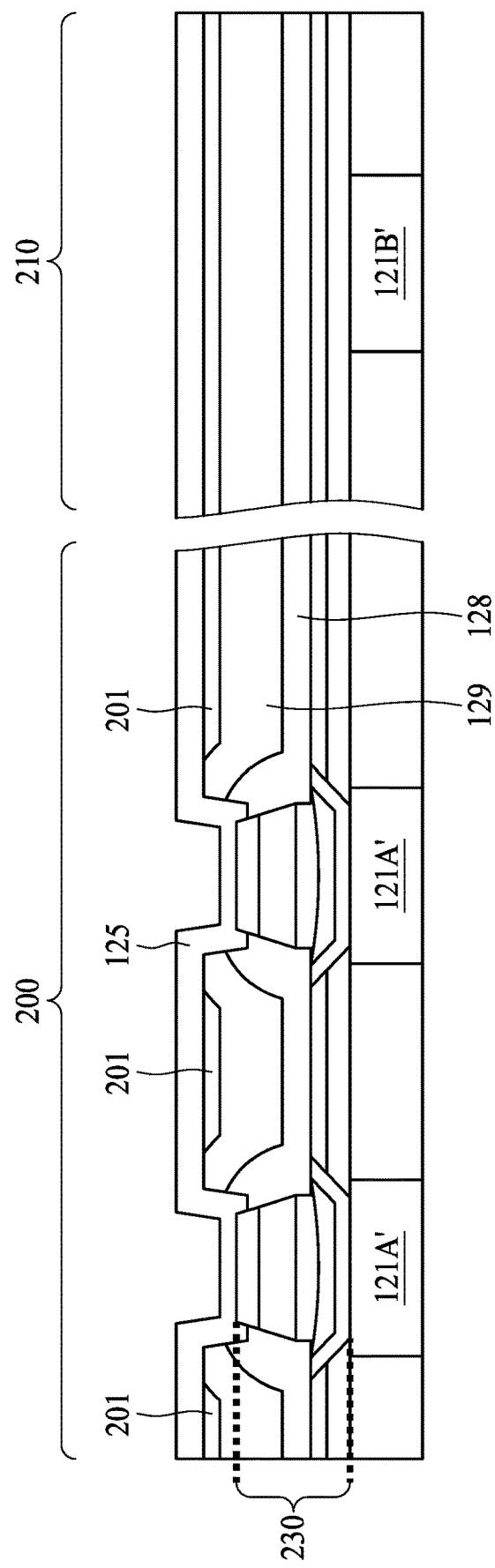

Referring to FIG. 10, a lateral etch operation is further performed to remove the sidewall spacer 128 over each of the MTJs 230 within the memory region 200. The etch rate of the sidewall spacer 128 shall be significantly greater than that of the top electrode 133 in the lateral etch operation, thereby the sidewall spacer 128 can partially be removed until an exposure of the sidewall of the top electrode 133 of one of the plurality of MTJs 230 substantially without etching into the top electrode 133. In some embodiments, a portion of the sidewall of the top electrode 133 is exposed after the lateral etch operation. Referring to FIG. 11, a top electrode via layer 125 is deposited over the planarization etch stop layer 201 within both the memory region 200 and the periphery region 210. The top electrode via layer 125 contoured the concaving upward top electrode via trenches 125', also forming concaving upward shapes. In some embodiments, the top electrode via layer 125 may include titanium (Ti), titanium nitride (TiN), or the like.

Figure 12:
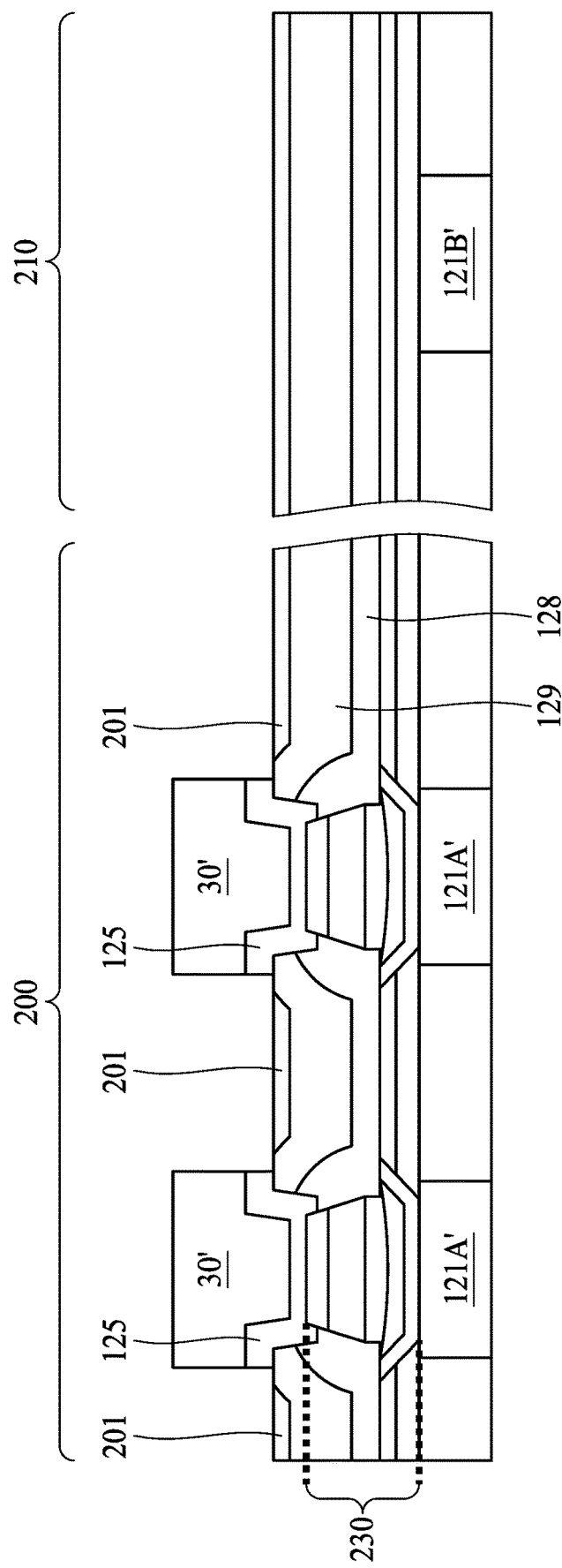

Referring to FIG. 12, a second photoresist layer 30' is patterned over the top electrode via layer 125 above each of the MTJs 230 and inside the contoured top electrode layer trenches 125" (shown in FIG. 10). The remaining part of the top electrode via layer 125 not covered by the second photoresist layer 30' is removed. After removing the second photoresist layer 30', a plurality of top electrode via 125 having concaving upward shapes are exposed. As shown in FIG. 12, the planarization etch stop layer 201 in the periphery region 210 and the memory region 200 is exposed after the patterning of the top electrode via layer 125. The patterned top electrode via layer 125 is in contact with the top surface of at least one of the top electrode 133 in order to electrically couple to the MTJs 230. In some embodiments, the top electrode via 125 is further in contact with a portion of the sidewall of at least one of the top electrode 133 in order to further decrease the resistance. The second photoresist layer 30' above the MTJs 230 is removed subsequently.

Figure 13:
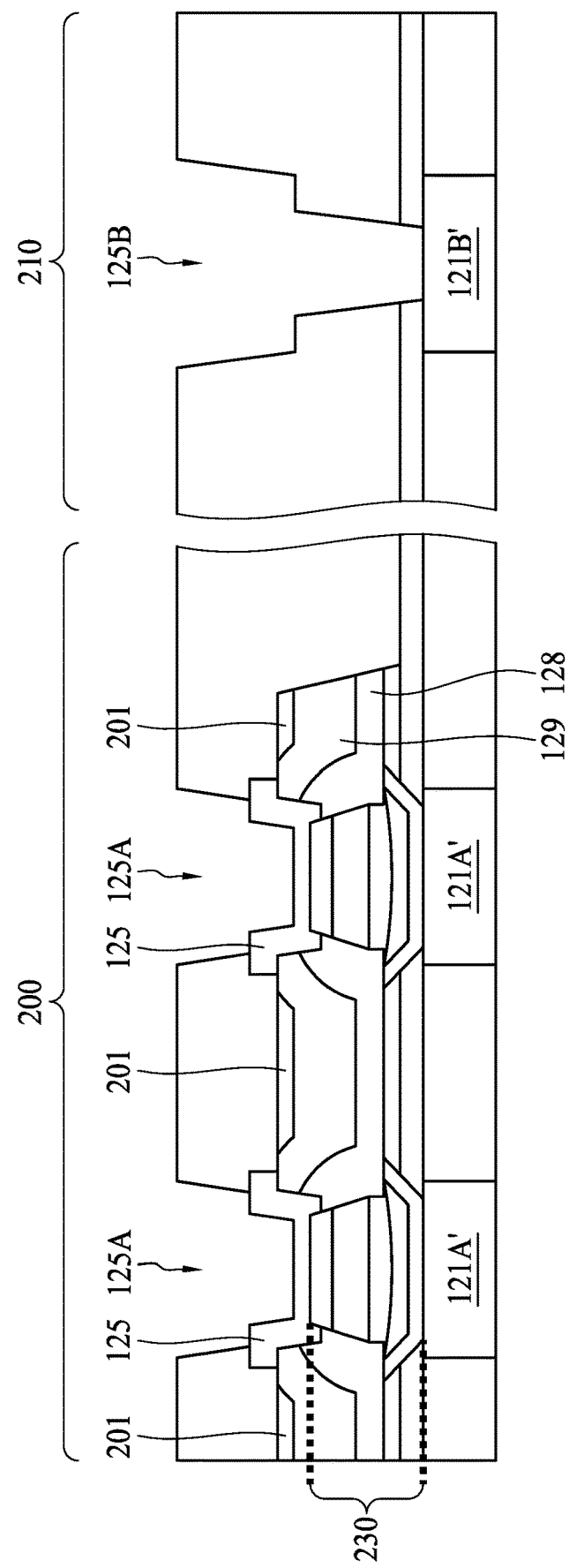

Referring to FIG. 13, the stacks over the periphery region 210, including the planarization etch stop layer 201, the sidewall spacer 128, and the oxide layer 129, are removed. Subsequently, both the memory region 200 and the periphery region 210 are covered by dielectric material. The $(N+M)^{th}$ metal line trenches 125A within the memory region 200 are formed above the top electrode, as the $(N+M)^{th}$ metal line trenches 125B within the periphery region 210 are formed above the $N^{th}$ metal layer 121B'.

Figure 14:
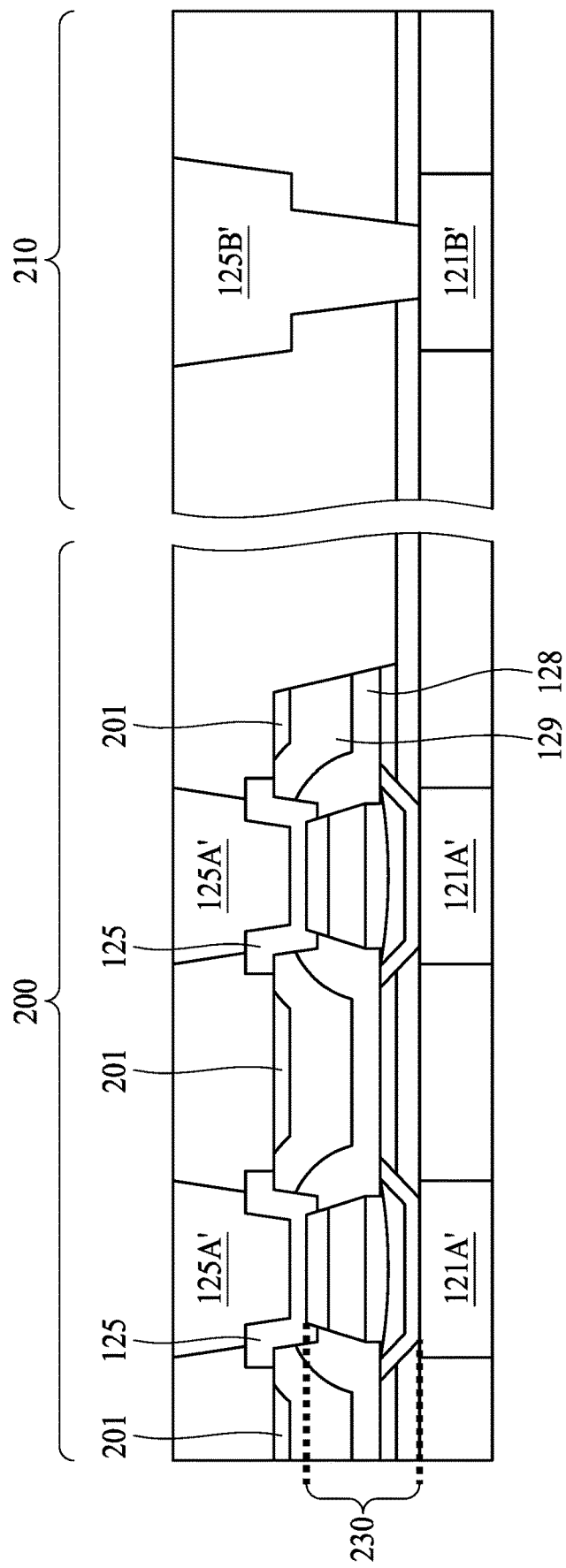

Referring to FIG. 14, a conductive metal is filled into the metal line trenches 125A and 125B, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. In some embodiments, the $(N+M)^{th}$ metal layers 125A' and 125B' may be formed from copper (Cu), W, AlCu, or the like. In some embodiments, $(N+M)^{th}$ metal layers 125A' and 125B' may be formed using the Damascene operation, which should be familiar to those in the art. First, trenches are etched through the dielectric material. This process can be performed by plasma etch operation, such as an Inductively Coupled Plasma (ICP) etch. A dielectric liner (not shown) then may be deposited on the sidewalls of the $(N+M)^{th}$ metal line trenches 125A and 125B. In embodiments, the liner materials may include silicon oxide (SiOx) or silicon nitride (SiNx), which may be formed by plasma deposition process, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode 133. Then a layer of copper is deposited in the trenches 125A and 125B, followed by planarization of the copper layer, such as by chemical mechanical polishing (CMP), down to the top surface of a dielectric material. The exposed copper surface and dielectric material can be coplanar.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Some embodiments of the present disclosure provide a semiconductor structure including a memory region. The memory region includes an $N^{th}$ metal layer, a plurality of magnetic tunneling junctions (MTJs) over the $N^{th}$ metal layer, the plurality of MTJs having at least one of mixed pitches and mixed sizes, a top electrode via concaving upward over each of the plurality of MTJs, and an $(N+M)^{th}$ metal layer over the plurality of MTJs. N is an integer greater than or equal to 1, and M is an integer greater than or equal to 1.

Some embodiments of the present disclosure provide a method for manufacturing a semiconductor structure. The method includes (1) forming an $N^{th}$ metal layer, (2) forming a plurality of magnetic tunneling junctions (MTJs) over the $N^{th}$ metal layer, the plurality of MTJs having at least one of mixed pitches and mixed sizes, (3) forming a top electrode via concaving upward over each of the plurality of MTJs, and (4) forming an $(N+M)^{th}$ metal layer over the plurality of MTJs. N is an integer greater than or equal to 1, and M is an integer greater than or equal to 1.

Some embodiments of the present disclosure provide a method for manufacturing a semiconductor structure. The method includes (1) forming an $N^{th}$ metal layer in a memory region and a periphery region, (2) forming a plurality of magnetic tunneling junctions (MTJs) over the $N^{th}$ metal layer in the memory region, the plurality of MTJs having at least one of mixed pitches and mixed sizes, (3) forming a top electrode via concaving upward over each of the plurality of MTJs in the memory region, and (4) forming an $(N+M)^{th}$ metal layer in the memory region and the periphery region. N is an integer greater than or equal to 1, and M is an integer greater than or equal to 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, the method comprising:
   forming an $N^{th}$ metal layer in a memory region and in a periphery region;
   forming a plurality of magnetic tunneling junctions (MTJs) in the memory region, the plurality of MTJs having at least one of mixed pitches and mixed sizes;
   forming a planarization etch stop layer in the memory region and in the periphery region; and
   performing an etch back operation on a coating layer over the planarization etch stop layer until a portion of the planarization etch stop layer in the memory region is removed,
   wherein N is an integer greater than or equal to 1, and wherein performing the etch back operation comprises leaving the planarization etch stop layer in the periphery region when the portion of the planarization etch stop layer in the memory region is removed.

2. The method of claim 1, wherein performing the etch back operation comprises exposing an oxide layer underlying the planarization etch stop layer.

3. The method of claim 2, wherein performing the etch back operation comprises leaving a portion of the planarization etch stop layer in the memory region and covering the oxide layer.

4. The method of claim 2, wherein a top surface of each of the MTJs is covered by the oxide layer after the etch back operation.

5. The method of claim 2, further comprising:
   patterning top electrode via trenches in the oxide layer of the memory region; and
   forming a top electrode via layer in the top electrode via trenches.

6. The method of claim 1, further comprising performing a planarization operation over the memory region and the periphery region after the etch back operation.

7. The method of claim 6, wherein the planarization etch stop layer in the memory region and in the periphery region is exposed after the planarization operation.

8. The method of claim 7, wherein the planarization etch stop layer being exposed comprises discrete patterns from a top view perspective.

9. A method for manufacturing a semiconductor structure, the method comprising:
   forming a plurality of magnetic tunneling junctions (MTJs) in a memory region, the plurality of MTJs having at least one of mixed pitches and mixed sizes;
   forming a sidewall spacer layer in the memory region and the periphery region over the plurality of MTJs;
   forming an oxide layer in the memory region over the sidewall spacer layer and in a periphery region adjacent to the memory region;
   forming a planarization etch stop layer over the oxide layer; and
   performing an etch back operation until a portion of oxide layer in the memory region is exposed.

10. The method of claim 9, further comprising performing a planarization operation after the etch back operation to expose the planarization etch stop layer.

11. The method of claim 10, wherein exposing the planarization etch stop layer comprises forming the planarization etch stop layer having a discrete pattern staggering from the plurality of MTJs from a top view perspective.

12. The method of claim 9, further comprising:
   patterning top electrode via trenches in the oxide layer of the memory region; and
   forming a top electrode via layer over the memory region and the periphery region.

13. The method of claim 9, wherein forming the planarization etch stop layer comprises depositing a nitride or oxynitride layer over the memory region and the periphery region.

14. A method for manufacturing a semiconductor structure, the method comprising:

forming an N$^{th}$ metal layer in a memory region and in a periphery region;

forming a plurality of magnetic tunneling junctions (MTJs) in the memory region, the plurality of MTJs having at least one of mixed pitches and mixed sizes;

forming a sacrificial layer in the memory region and in the periphery region; and performing an etch back operation until a portion of the sacrificial layer in the memory region is removed, wherein N is an integer greater than or equal to 1, and wherein performing the etch back operation comprises leaving the sacrificial layer in the periphery region when the portion of the sacrificial layer in the memory region is removed.

15. The method of claim 14, further comprising forming a planarization etch stop layer in the memory region and in the periphery region prior to forming the sacrificial layer.

16. The method of claim 14, further comprising performing a planarization operation over the memory region and the periphery region after the etch back operation.

17. The method of claim 16, further comprising forming an oxide layer prior to forming the planarization etch stop layer, wherein performing the etch back operation comprises removing a portion of the planarization etch stop layer until an exposure of the oxide layer.

18. The method of claim 17, further comprising forming a top electrode trench subsequent to performing the planarization operation.

19. The method of claim 18, wherein forming the top electrode trench comprises:

patterning a mask layer over the oxide layer and the planarization etch stop layer; and performing a first etch to remove a portion of the oxide layer until exposing a sidewall spacer layer surrounding and covering the plurality of MTJs.

20. The method of claim 19, further comprising performing a second etch to remove a portion of the sidewall spacer layer until exposing a top electrode of one of the MTJs.

\* \* \* \* \*